United States Patent
Smith

(10) Patent No.: US 6,292,409 B1
(45) Date of Patent: Sep. 18, 2001

(54) SYSTEM FOR PROGRAMMABLE CHIP INITIALIZATION

(75) Inventor: Paul J. Smith, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/734,999

(22) Filed: Dec. 12, 2000

(51) Int. Cl.[7] ....................................... G11C 7/00
(52) U.S. Cl. .................. 365/189.11; 365/185.25
(58) Field of Search ........................... 365/189.11, 185.25

(56) References Cited

U.S. PATENT DOCUMENTS 5,455,923 * 10/1995 Kaplinsky .......................... 395/481
6,078,541 * 6/2000 Kitagawa ........................ 365/230.01

* cited by examiner

Primary Examiner—A. Zarabian

(57) ABSTRACT

A programmable input/output (I/O) pad internal resistive pull circuit assembly capable of providing programmable chip (SCSI Controller) initialization is disclosed. In an exemplary embodiment, the assembly includes a non-volatile memory cell disposed in said non-volatile memory device. First and second transistor devices are coupled to the non-volatile memory cell. The non-volatile memory cell is capable of being programmed for providing at least one of a pull-up and a pull-down on an associated signal line of the non-volatile memory device thereby furnishing a predetermined reset value to a controller device of the control system.

21 Claims, 3 Drawing Sheets

SYSTEM FOR PROGRAMMABLE CHIP INITIALIZATION

FIELD OF THE INVENTION

The present invention generally relates to the field of initialization of control systems, and more particularly to a system for programmable chip initialization wherein the Reset state of the controller such a system is initialized.

BACKGROUND OF THE INVENTION

Multiple levels of initialization are required for various control systems. The lowest or first level of initialization is signaled to begin with the assertion and de-assertion of the system "Reset" signal. When Reset is asserted the Controller device (see FIG. 1) is put into a known state and when Reset is de-asserted the Controller begins a sequence of operations which is dictated by the Controller's initial (i.e., Reset) state. Subsequently, the Controller may begin the next level of system initialization. This level might be to begin execution of commands fetched from EPROM (Erasable Programable Read Only Memory) or some other type of non-volatile memory, and/or to download initialization values from the same memory into it's local register set. Higher levels of initialization would follow and would be determined by software.

The present invention pertains to the lowest level of initialization where the Reset state of the Controller is determined. The current method of altering the Reset state of the Controller is shown in FIG. 1. Shown is a simplified system 100 with a Controller device 102 and an EPROM device 104 interconnected with control, address, and data lines and sharing a common Reset input signal. While Reset is asserted the "Data0", "Data1", "Data2", and "Data3" lines, are pulled to a resistive state as determined by the resistors "R0", "R1", "R2", and "R3", as the internal drivers in the EPROM and Controller devices 102 & 104 are turned off (i.e., placed in a high impedance state). Thus the Reset state is determined by the resistors which are connected to either a high level (VDD) or a low level (VSS). When Reset is de-asserted the values on the "Data0", "Data1", "Data2", and "Data3" lines are captured by the Controller 102 as the Reset state of those lines and the following state sequences of the Controller 102 will be conditional on the initial state of those lines. This allows the Controller 102, for example, to vary it's starting address in program memory from which to fetch commands. As shown in the timing diagram 200 of FIG. 2, at time "t1" 202, the Reset signal is asserted and the Data Bus (signals "Data0", "Data1", "Data2", and "Data3" of FIG. 1) transitions to the resistive pull values at time "t2" 204. At time "t3" 206, Reset is de-asserted and the Pull Value of the Data Bus is captured internally to the Controller 102 (FIG. 1) as the Initialization Value at time "t4" 208.

Presently, the initialization configuration of control systems such as system 100 is physically selected by soldering pull-up (or pull down) resistors (e.g., resistors "R0", "R1", "R2", and "R3") to the system's circuit board. Further, the pull values for the data lines are set with mechanical switches or jumpers which would also be located on the circuit board that would select between the VSS (low) or VDD (high) supplies for each of the data lines. To change the pull values in the system the user would have to remove the board from the system and physically change the switch or jumper settings according to their specific needs. Thus, changing of chip (SCSI Controller) initialization options would require hardware changes to the system circuit board. Such changes are costly and difficult to implement.

Consequently, it is desirable to provide a method and apparatus for programmable chip initialization wherein the Reset state of the controller of such a system is initialized.

SUMMARY OF THE INVENTION

Accordingly, the present invention is directed to a programmable input/output (I/O) pad internal resistive pull circuit assembly for a non-volatile memory device of a control system capable of providing programmable chip (SCSI Controller) initialization. In an exemplary embodiment, the assembly includes a non-volatile memory cell disposed in the non-volatile memory device. First and second transistor devices are coupled to the non-volatile memory cell. The non-volatile memory cell is capable of being programmed for providing at least one of a pull-up and a pull-down on an associated signal line of the non-volatile memory device thereby furnishing a predetermined reset value to a controller device of the control system.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

Figure 3:
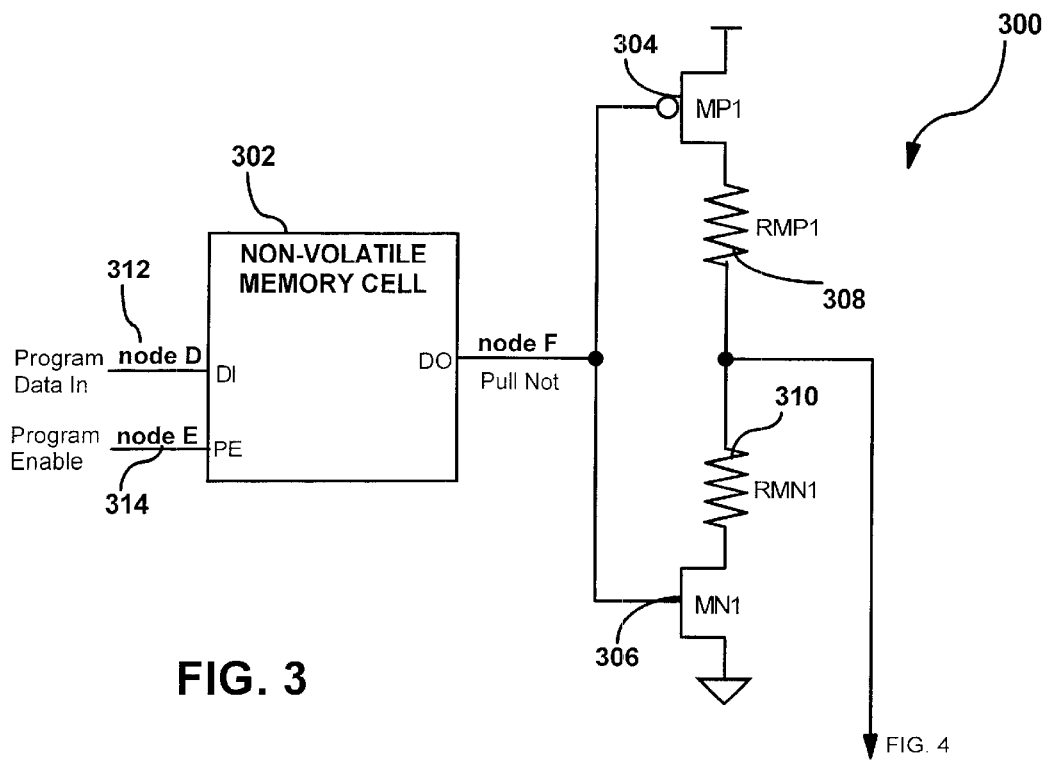
FIG. 3 is a circuit diagram illustrating a programmable Input/Output (I/O) internal resistive pull circuit assembly in accordance with an exemplary embodiment of the present invention.

Referring now to FIG. 3, a programmable Input/Output (I/O) internal resistive pull circuit assembly 300 in accordance with an exemplary embodiment of the present invention is described. The programmable I/O pad internal resistive pull circuit 300 replaces the external resistor network (e.g., resistors "R0", "R1", "R2", and "R3") and switches or jumpers of the system illustrated in FIG. 1. As shown, the programmable I/O pad internal resistive pull circuit 300 may be connected to the I/O pad circuit 400 shown in FIG. 4, which is an input/output pad circuit in this example but could also be just an input pad circuit or just an output pad circuit.

Figure 1:
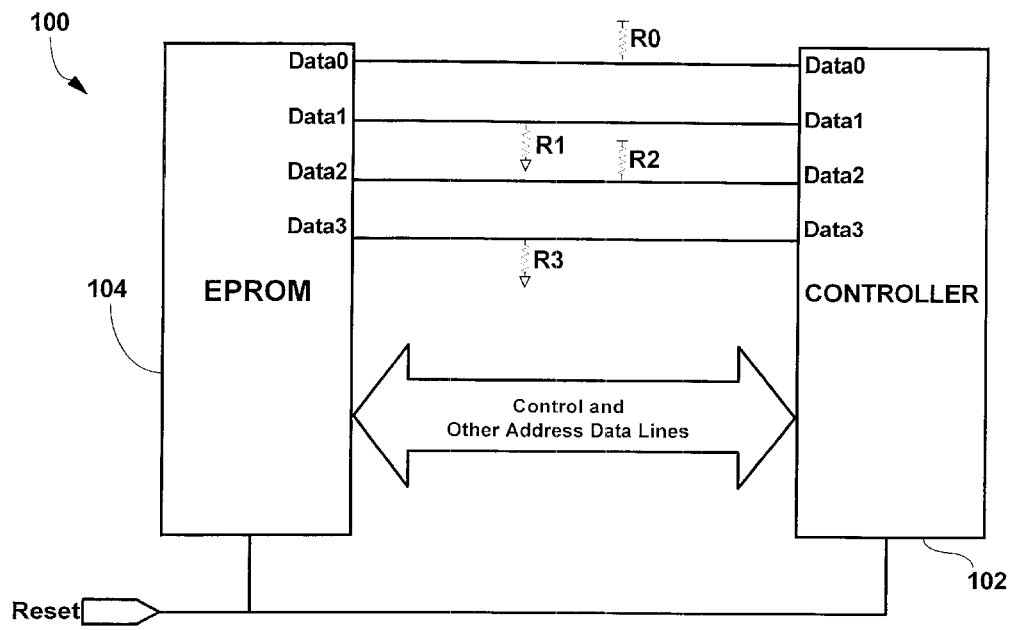
FIG. 1 is a block diagram illustrating the present system for chip (SCSI controller) initialization.

In an exemplary embodiment shown in FIG. 3, the programmable I/O pad internal resistive pull circuit assembly 300 is comprised of a non-volatile memory cell 302 which could be of any given non-volatile memory technology incorporated for the design of the external memory device EPROM 104 shown in FIG. 1. Two transistors "MP1" 304, a p-channel transistor, and "MN1" 306, a n-channel transistor, are coupled to the output "node F" of the non-volatile memory cell 302. In the embodiment shown, p-channel and n-channel transistors 304 & 306 are selected since a Complementary Metal-Oxide Semiconductor (CMOS) technology is utilized. However, it will be appreciated by those of skill in the art that other technologies and transistor types could be used without departing from the scope and spirit of the present invention. Two resistors, "RMP1" 308, which is associated with the transistor "MP1" 304, and "RMN1" 310, which is associated with the transistor "MN1" 304 are also provided. These resistors 308 & 310 may, in one embodiment, be incorporated into the transistors 304 & 306 such that the transistors 304 & 306 are designed to have an equivalent on-resistance. Alternately, the resistors 308 & 310 may be constructed separate from the associated transistors 304 & 306.

Figure 2:
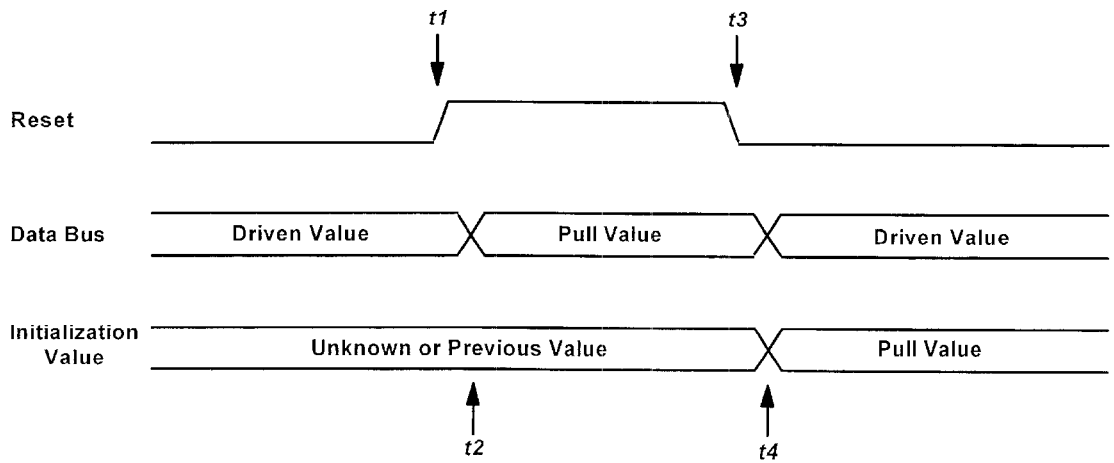
FIG. 2 is a timing diagram illustrating initialization value capture for the system shown in FIG. 1.
Figure 4:
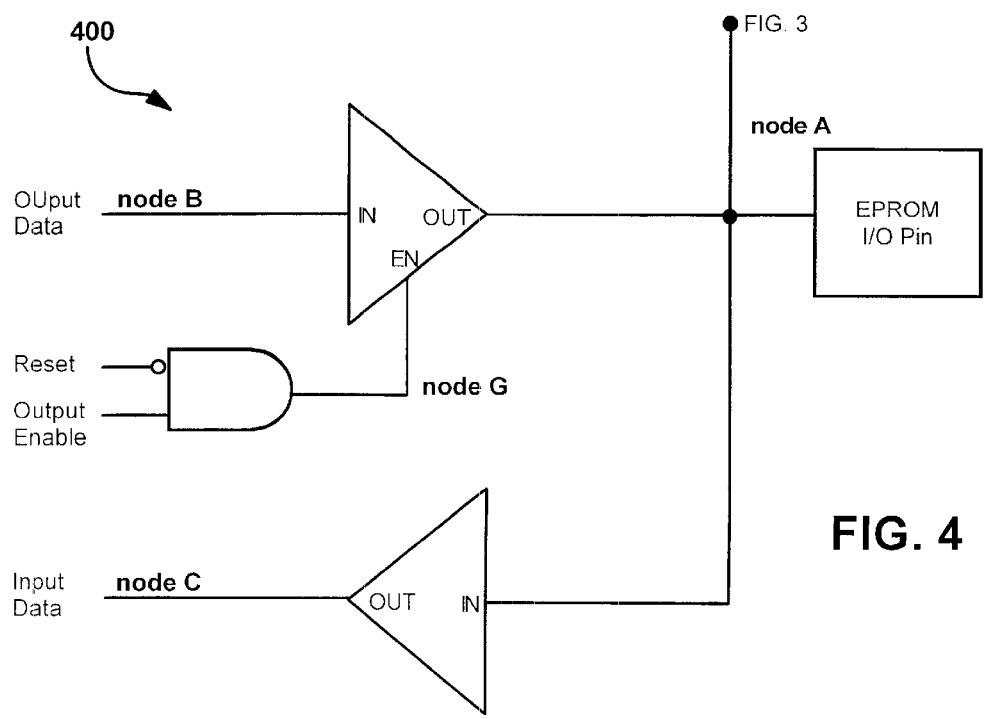
FIG. 4 is a circuit diagram illustrating an Input/Output (I/O) pad circuit assembly.

As shown in FIGS. 3 and 4, prior to normal system operation the non-volatile memory cell 302 (FIG. 3) may be programmed via the node D and node E inputs 312 & 314 to the memory cell 302 through any of various means of programming such as, for example: a serial port interface, a test port such as JTAG (Joint Test Action Group), or a special control sequence on the EPROM (or other non-volatile memory device) 104 control inputs. If a pull-up on the associated signal line is desired, a logic zero may be written to the non-volatile memory cell 302. Similarly, if a pull-down on the associated signal line is desired, a logic one may be written to the non-volatile memory cell 302. This would be the case for each of the signal lines where a particular Reset state value is desired. During normal operation the pull values are captured off of the signal lines in the same fashion as the prior method, as illustrated in FIG. 2 and discussed above.

Figure 5:
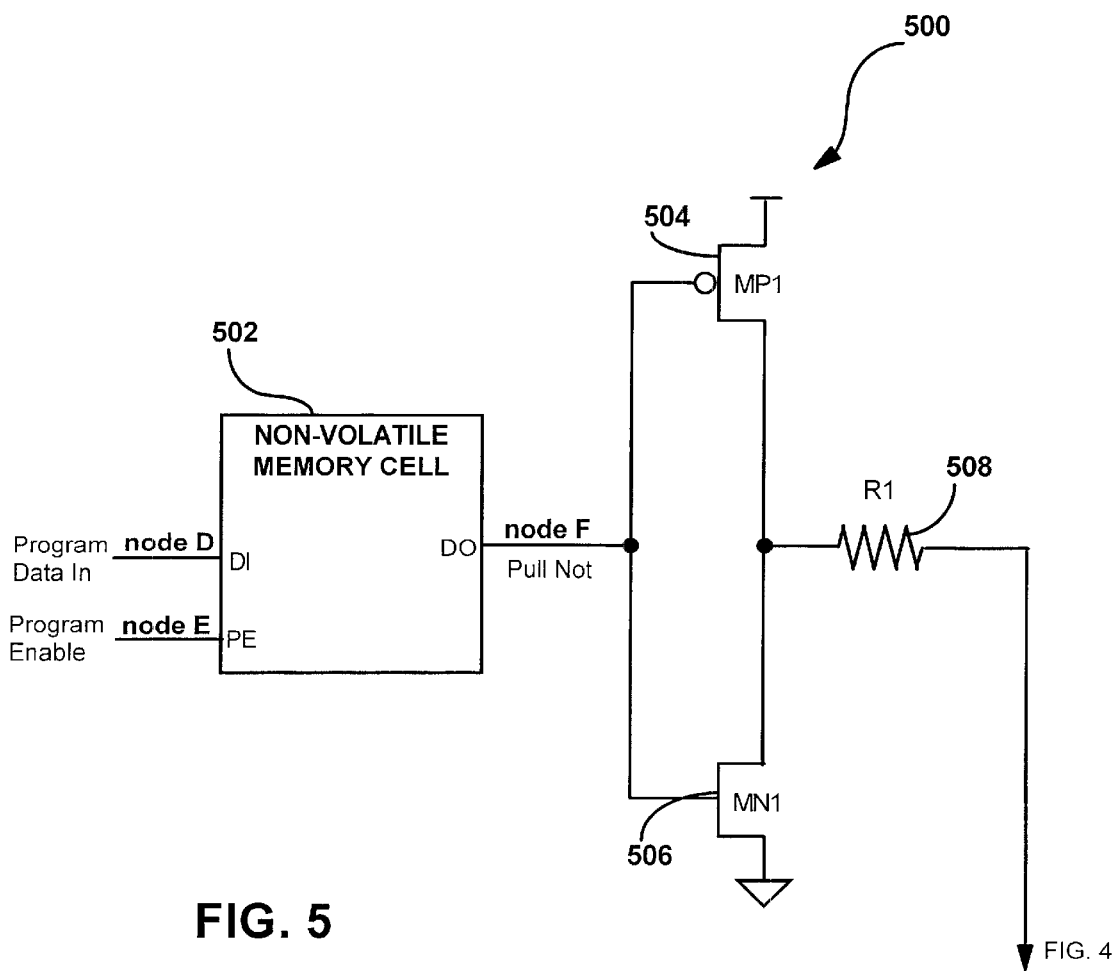
FIG. 5 is a circuit diagram illustrating a programmable Input/Output (I/O) internal resistive pull circuit assembly in accordance with a second exemplary embodiment of the present invention.

Referring now to FIG. 5, a programmable Input/Output (I/O) internal resistive pull circuit assembly 500 in accordance with a second exemplary embodiment of the present invention is shown. The programmable I/O pad internal resistive pull circuit 500 is similar to the circuit assembly 300 shown in FIG. 3 and likewise replaces the external resistor network (e.g., resistors "R0", "R1", "R2", and "R3") and switches or jumpers of the system illustrated in FIG. 1. As shown, the programmable I/O pad internal resistive pull circuit 500 may be connected to the I/O pad circuit 400 (or alternately input pad circuit or output pad circuit) shown in FIG. 4. As shown in FIG. 5, the programmable I/O pad internal resistive pull circuit assembly 500 is comprised of a non-volatile memory cell 502 which could be of any given non-volatile memory technology incorporated for the design of the external memory device EPROM 104 shown in FIG. 1. Two transistors "MP1"504, a p-channel transistor, and "MN1" 506, a n-channel transistor, are coupled to the output "node F" of the non-volatile memory cell 502. In the embodiment shown, p-channel and n-channel transistors 504 & 506 are selected since a Complementary Metal-Oxide Semiconductor (CMOS) technology is utilized. However, it will be appreciated by those of skill in the art that other technologies and transistor types could be used without departing from the scope and spirit of the present invention. In the embodiment shown in FIG. 5, a single resistor "R1" 508 replaces resistors "RMP1" 308 and "RMN1" 310 of the embodiment shown in FIG. 3. This resistor 508 is constructed separate from the associated transistors 504 & 506.

As shown in FIGS. 3,4, and 5 resistors "RMP1" 308 and "RMN1" 310 or alternately resistor "R1" 502 are preferably incorporated into the design of the internal I/O circuits of the EPROM (or other non-volatile memory device) such that the pull values are electrically programmable. In this manner, the resistor network located on the system circuit board for defining the initial state values of the data pins and associated jumpers or switches are eliminated as board components thus reducing the manufacturing cost of the system. Also the pull values can be programmed electrically via a serial port interface, through a test port such as JTAG, by a special control sequence on the EPROM (or other non-volatile memory device) control lines, or other means, without removing the circuit board from the system.

It is believed that the system for programmable chip initialization of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A programmable I/O pad internal resistive pull circuit assembly for a non-volatile memory device, comprising:

a non-volatile memory cell disposed in said non-volatile memory device a first transistor device coupled to said non-volatile memory cell; and a second transistor device coupled to said non-volatile memory cell;

wherein said non-volatile memory cell is capable of being programmed for providing at least one of a pull-up and a pull-down on an associated signal line of the non-volatile memory device thereby furnishing a predetermined reset value to a controller device of a control system.

2. The programmable I/O pad internal resistive pull circuit assembly according to claim 1, wherein said non-volatile memory device comprises an Erasable Programable Read Only Memory (EPROM).

3. The programmable I/O pad internal resistive pull circuit assembly according to claim 1, further comprising a resistor device.

4. The programmable I/O pad internal resistive pull circuit assembly according to claim 1, further comprising a first resistor device associated with said first transistor device and a second resistor device associated with said second transistor device.

5. The programmable I/O pad internal resistive pull circuit assembly according to claim 4, wherein said first and second resistor devices are incorporated into said first and second transistor devices respectively so that said first and second transistor devices designed to have an equivalent on-resistance.

6. The programmable I/O pad internal resistive pull circuit assembly according to claim 1, wherein said first and second transistor devices comprise Complementary Metal-Oxide Semiconductor (CMOS) devices.

7. The programmable I/O pad internal resistive pull circuit assembly according to claim 6, wherein said first transistor device comprises a p-channel transistor and said second transistor device comprises an n-channel transistor.

8. A non-volatile memory device suitable for being coupled to a controller device of a control system, comprising:

a I/O circuit assembly; and a programmable I/O pad internal resistive pull circuit assembly further comprising:

a non-volatile memory cell disposed in said non-volatile memory device a first transistor device coupled to said non-volatile memory cell; and a second transistor device coupled to said non-volatile memory cell;

wherein said non-volatile memory cell is capable of being programmed for providing at least one of a pull-up and a pull-down on an associated signal line of the non-volatile memory device thereby furnishing a predetermined reset value to the controller device of the control system.

9. The non-volatile memory device according to claim 8, wherein said programmable I/O pad internal resistive pull circuit assembly further comprises a resistor device.

10. The non-volatile memory device according to claim 8, wherein said programmable I/O pad internal resistive pull circuit assembly further comprises a first resistor device associated with said first transistor device and a second resistor device associated with said second transistor device.

11. The non-volatile memory device according to claim 10, wherein said first and second resistor devices are incorporated into said first and second transistor devices respectively so that said first and second transistor devices designed to have an equivalent on-resistance.

12. The non-volatile memory device according to claim 8, wherein said first and second transistor devices comprise Complementary Metal-Oxide Semiconductor (CMOS) devices.

13. The non-volatile memory device according to claim 12, wherein said first transistor device comprises a p-channel transistor and said second transistor device comprises an n-channel transistor.

14. A control system, comprising:

a controller device; and a non-volatile memory device including a programmable I/O pad internal resistive pull circuit assembly further comprising:

a non-volatile memory cell disposed in said non-volatile memory device a first transistor device coupled to said non-volatile memory cell; and a second transistor device coupled to said non-volatile memory cell;

wherein said non-volatile memory cell is capable of being programmed for providing at least one of a pull-up and a pull-down on an associated signal line of the non-volatile memory device thereby furnishing a predetermined reset value to the controller device of the control system.

15. The control system according to claim 14, wherein said programmable I/O pad internal resistive pull circuit assembly further comprises a resistor device.

16. The control system according to claim 14, wherein said programmable I/O pad internal resistive pull circuit assembly further comprises a first resistor device associated with said first transistor device and a second resistor device associated with said second transistor device.

17. The control system according to claim 16, wherein said first and second resistor devices are incorporated into said first and second transistor devices respectively so that said first and second transistor devices designed to have an equivalent on-resistance.

18. The control system according to claim 14, wherein said first and second transistor devices comprise Complementary Metal-Oxide Semiconductor (CMOS) devices.

19. The non-volatile memory device according to claim 18, wherein said first transistor device comprises a p-channel transistor and said second transistor device comprises an n-channel transistor.

20. The control system according to claim 14, wherein said non-volatile memory device comprises an Erasable Programable Read Only Memory (EPROM).

21. The control system according to claim 14, wherein said non-volatile memory further comprises an I/O circuit assembly.

\* \* \* \* \*